United States Patent
Liu

(10) Patent No.: US 7,224,857 B2
(45) Date of Patent: May 29, 2007

(54) OPTICAL-ROUTING BOARDS FOR OPTO-ELECTRICAL SYSTEMS AND METHODS AND APPARATUSES FOR MANUFACTURING THE SAME

(75) Inventor: Kuo-Chuan Liu, Fremont, CA (US)

(73) Assignee: Fujitsu Limited, Kawasaki (JP)

( * ) Notice: Subject to any disclaimer, the term of this patent is extended or adjusted under 35 U.S.C. 154(b) by 178 days.

(21) Appl. No.: 11/018,824

(22) Filed: Dec. 20, 2004

(65) Prior Publication Data
US 2006/0133718 A1 Jun. 22, 2006

(51) Int. Cl.
*G02B 6/12* (2006.01)
(52) U.S. Cl. .................. 385/14; 385/15; 385/130; 385/131; 250/214.1
(58) Field of Classification Search ............... 385/14, 385/15, 27, 30, 49, 129–132; 250/214.1, 250/214 R
See application file for complete search history.

(56) References Cited

U.S. PATENT DOCUMENTS

| | | | |
|---|---|---|---|
| 5,786,560 A | 7/1998 | Tatah et al. | |
| 6,134,369 A | 10/2000 | Kurosawa | |
| 6,617,568 B1 * | 9/2003 | Matsuda | 250/214.1 |

OTHER PUBLICATIONS

Eric Mazur, et al., "Femtosecond Micromachining of Transparent Materials," OSA Annual Meeting, Providence RI, USA, Oct. 24, 2000, slide presentation, 85 pages.
Femtolasers Produktions GmbH, "Femtosource Compact," Advertisement, Published on or before Dec. 2001, 1 page.
Spectra-Physics, "Got an Ultrafast Application? Get a Mai Tai," Advertisement, Copyrighted 2000, Published on or before Dec. 2001, 1 page.
Clark-MXR, Inc, "Direct Write Waveguides!," Website, http://www.cmxr.com/Industrial/Waveguides.htm, download date Dec. 13, 2001. 1 page.
Clark-MXR, Inc, Examples from the Clark-MXR website, download date on or before Dec. 2001, 2 pages.

* cited by examiner

*Primary Examiner*—Ellen E. Kim
(74) *Attorney, Agent, or Firm*—Sheppard Mullin Richter & Hampton LLP

(57) ABSTRACT

Disclosed are optical-routing boards for opto-electrical systems having optical waveguides embedded in non-laminated optical substrates that enable optical signals to be routed among opto-electric components mounted on the top surfaces of the optical substrates. Methods for making the optical-routing boards are also disclosed. The waveguides are formed by focused pulse-laser writing, with the focal point of the pulsed-laser beam being moved in a three-dimensional manner through the non-laminated substrate. Bevel surfaces are preferably formed in the substrate to facilitate bending of the waveguides.

22 Claims, 6 Drawing Sheets

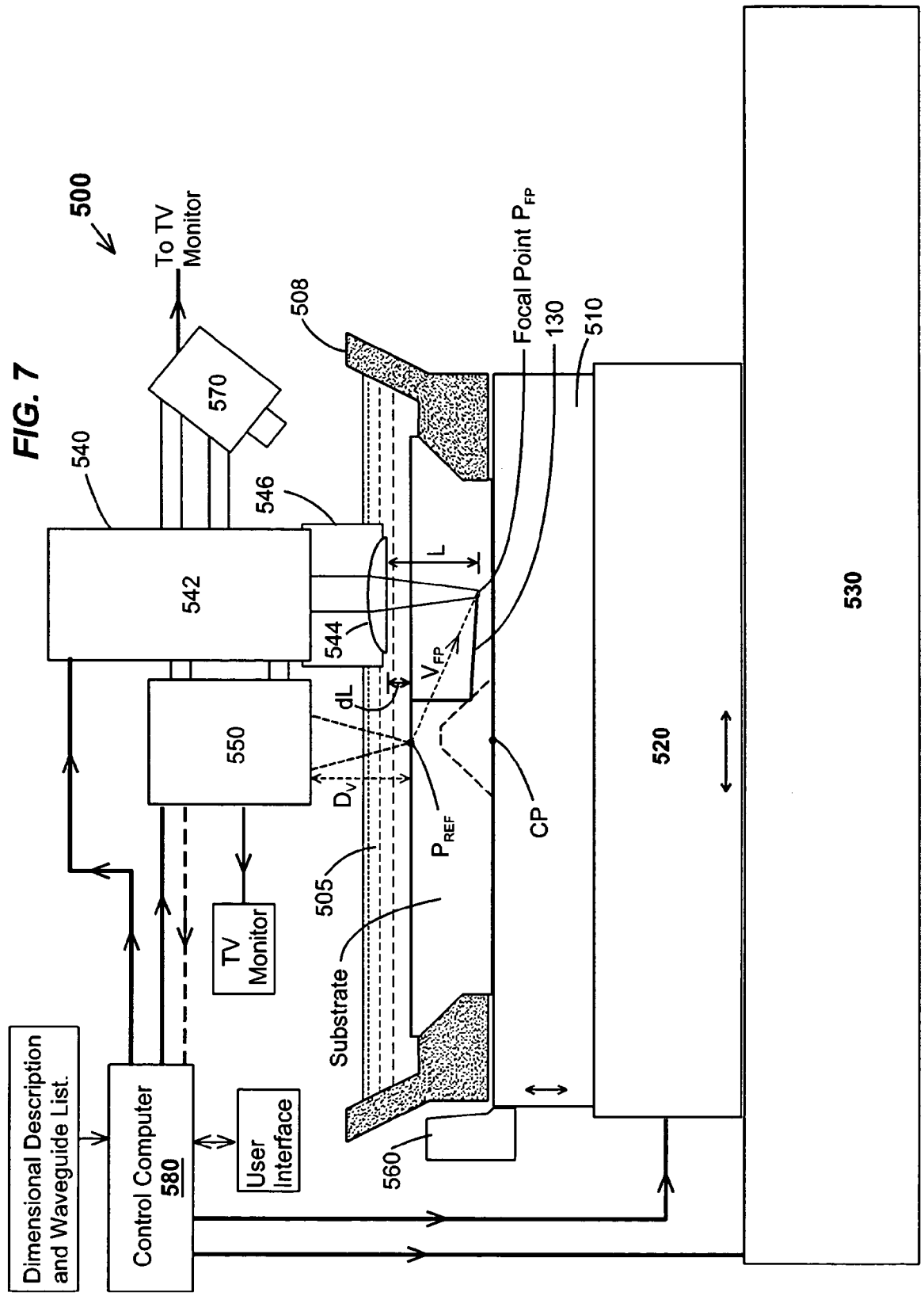

OPTICAL-ROUTING BOARDS FOR OPTO-ELECTRICAL SYSTEMS AND METHODS AND APPARATUSES FOR MANUFACTURING THE SAME

FIELD OF THE INVENTION

The present invention relates to boards for opto-electrical systems, and more particularly to boards having embedded optical waveguides that enable optical signals to be routed among opto-electric components mounted on the substrate.

BACKGROUND OF THE INVENTION

As high-end computers increase in complexity and chip count, the interconnections between IC chips have grown and bottleneck delays for these interconnections have increased. There have been many efforts to address the bottleneck delays by conveying some of the signals between chips by optical means. In these attempts, bottlenecked electrical signals are converted to optical signals by light transmitters, the optical signals are then propagated over long distances across an interconnect board by way of optical waveguides formed therein, and then received by light receivers and converted back to electrical signals. The optical waveguides in these boards are typically formed by polymer layers built up on top of the base substrates of the boards. However, the polymer materials for these layers have anisotropic dielectric constants, and thus have high degrees of birefringence. The birefringence hinders the transmission of signals in the waveguides by causing spatial and temporal dispersion of optical signals, and therefore hinders the ability to provide long interconnects.

The buildup process used to construct the waveguide layers is relatively expensive because a number of steps are involved, including steps to form cladding layers, core layers, and reflecting mirrors. The reflecting mirrors are used to direct light signals into and out of the waveguides from the top surface of the interconnect board, where the light transmitters and light receivers are located. Many such steps are involved when several tiers of waveguides are formed over one another. The number of steps involved increases the chances of a defect occurring in the manufacturing process, which decreases the yield of the process and increases the manufacturing cost.

Thus, in order to successfully pursue optical interconnects for electrical systems, the birefringence and dispersion of the optical signals conveyed through the waveguides must be reduced, the manufacturing yield must be increased, and the manufacturing costs must be reduced.

SUMMARY OF THE INVENTION

The present invention addresses the above problems by taking an approach to constructing the waveguides that is completely different from the conventional layer-buildup process. In exemplary embodiments according to the present invention, the waveguide cores are formed in a non-laminated substrate by focused, pulsed-laser beam writing, where the focal point of the pulsed-laser beam is moved in a three-dimensional manner through the non-laminated substrate. The untreated portions of the substrate serve as cladding material for the waveguide cores. A typical waveguide core has a long horizontal segment with two ends, and two short vertical segments disposed at respective ends of the horizontal segment. Each vertical segment has a first end optically coupled to the horizontal segment, and a second end disposed at or near the top surface of the substrate. The vertical segments couple light to and from optical components disposed on the top surface, while the horizontal segment acts to convey the optical signal over a long distance. Beveled surfaces are preferably disposed at each end of the horizontal segment to facilitate the bending of the light from the horizontal segment to the vertical segment, and vice versa. The beveled surfaces may be formed at one or more edges of the non-laminated substrate, and/or on the sidewalls of voids formed in the non-laminated substrate. Such voids are typically formed in the substrate from the bottom surface. Instead of using beveled surfaces, some or all of the waveguides can comprise bends at the points where their horizontal segments meet their vertical segments. The radius of curvature of such a bend is typically greater than 20 microns, in order to contain the light within the waveguide. Because of the latter consideration, waveguide cores using such bends should have a minimum spacing distance of 20 microns between their horizontal segments and the top surface of the substrate.

The formation methods according to the present invention enable the use of materials that have substantially isotropic dielectric constants, and thus have very low degrees of optical birefringence and dispersion. The incorporation of the beveled surfaces enables a higher density of waveguides to be formed by eliminating the need for a minimum spacing distance between the waveguide's horizontal segment and the substrate's top surface. (In other words, the beveled surfaces eliminate the need for using bends between the horizontal and vertical waveguide segments, so additional tiers of waveguides may be formed within the top 20 microns of the substrate.)

A first exemplary optical-routing board according to the present invention comprises a non-laminated substrate having a top surface, a bottom surface, and one or more sides. A first beveled surface is formed at a side, and a second beveled surface formed at the same side (such as in the case of a round or semi-round substrate) or a different side (such as in the case of a rectangular substrate). The first exemplary optical-routing board further comprises at least one waveguide core formed within the non-laminated substrate, the waveguide core having a first segment extending from the substrate's top surface to a first point on the first beveled surface, a second segment extending from the first point to a second point on the second beveled surface, and a third segment extending from the second point to the substrate's top surface.

A second exemplary optical-routing board according to the present invention comprises a non-laminated substrate having a top surface, a bottom surface, and at least one side. A first void is formed at the substrate's bottom surface, with the first void having at least one sidewall. The second exemplary optical-routing board further comprises a waveguide core formed within the non-laminated substrate, the waveguide core having a first segment extending from the substrate's top surface to a first point on the at least one sidewall of the first void, a second segment extending from the first point to a second point on the at least one side of the substrate.

A third exemplary optical-routing board according to the present invention comprises a non-laminated substrate having a top surface, a bottom surface, and at least one side. A first void and a second void are formed at the substrate's bottom surface, with each of the first and second voids having at least one sidewall. The third exemplary optical-routing board further comprises a waveguide core formed within the non-laminated substrate, the waveguide core having a first segment extending from the substrate's top surface to a first point on the at least one sidewall of the first void, a second segment extending from the first point to a second point on the at least one sidewall of the second void, and a third segment extending from the second point to the substrate's top surface.

An exemplary method of forming an optical-routing board according to the present invention comprises forming a beveled surface on a non-laminated substrate. The substrate has a top surface, a bottom surface, and at least one side, with the beveled surface being formed on the at least one side of the substrate or a sidewall of a void located at the bottom surface of the non-laminated substrate. The exemplary method further comprises forming a first waveguide-core segment in the substrate using a laser emitting pulsed light having pulse durations of less than 100 femto-seconds per pulse such that the first waveguide-core segment has a first end disposed substantially at the beveled surface at a first point and a second end disposed away from the first point. The method further comprises forming a second waveguide-core segment in the substrate using a laser emitting pulsed light having pulse durations of less than 100 femto-seconds per pulse such that the second waveguide-core segment has a first end disposed substantially at the first point and a second end disposed away from the first point. The second end of the first waveguide-core segment may be disposed near or at the top surface of the substrate, and the second end of the second segment may be disposed near the at least one side of the substrate, or at a second beveled surface located on a side of the substrate or a sidewall of a void formed in the substrate. Alternatively, the locations of the second ends of the first and second waveguide-core segments may be reversed.

Accordingly, it is an object of the present invention to provide optical interconnect boards for electronic systems and the like that have optical waveguides with low birefringence and dispersion properties.

It is another object of the present invention to enable the creation of long, low-loss optical waveguides in optical interconnect boards for electronic systems and the like.

It is another object of the present invention to enable the formation of a high-density of waveguides and a high number of tiered layers of waveguides in a non-laminated substrate.

It is another object of the present invention to increase the manufacturing yield and reduce the manufacturing cost for forming optical-interconnect boards for electronic systems and the like.

These and other objects of the present invention will become apparent to those skilled in the art from the following detailed description of the invention, the accompanying drawings, the appended claims.

BRIEF DESCRIPTION OF THE DRAWINGS

FIG. 7 is schematic diagram of an exemplary laser-writing apparatus according to the present invention.

DETAILED DESCRIPTION OF THE INVENTION

Figure 1:
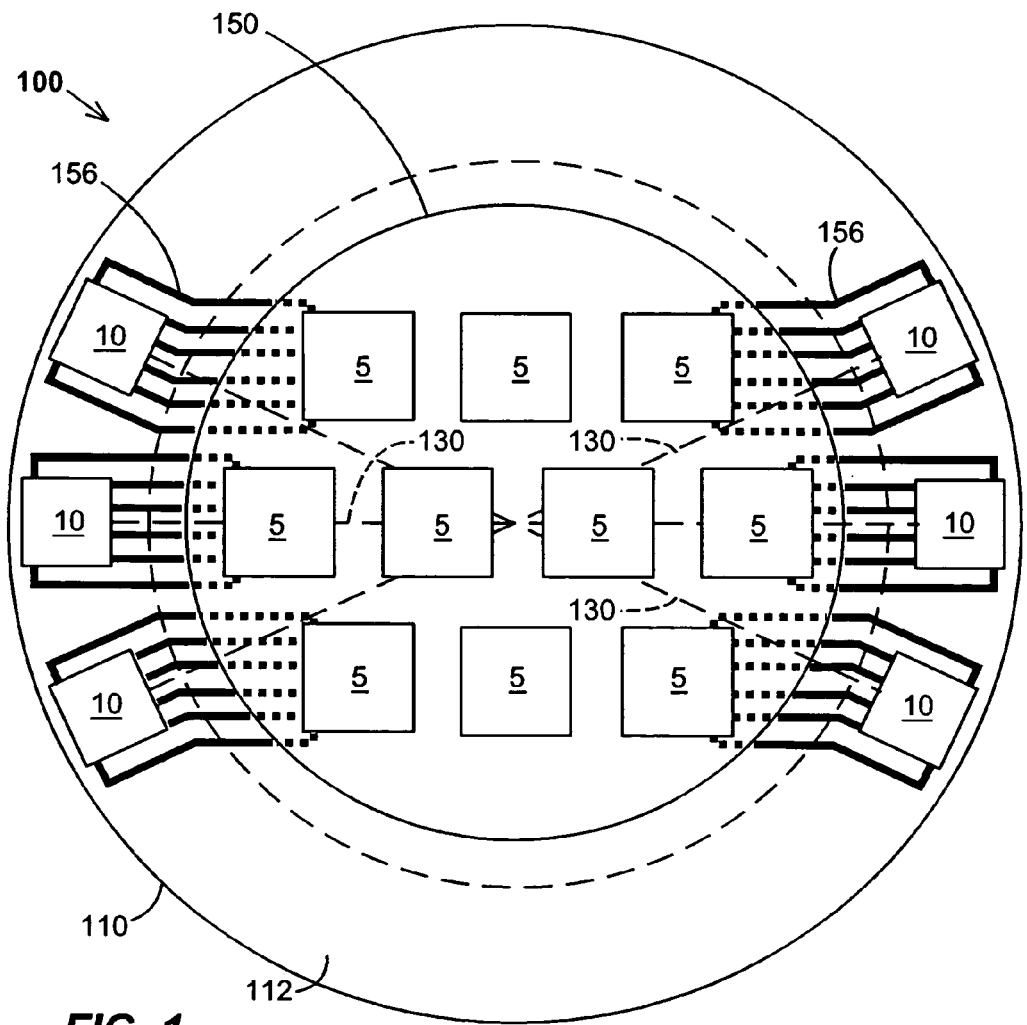
FIG. 1 shows a top plan view of a first exemplary optical-routing board according to the present invention.
Figure 2:
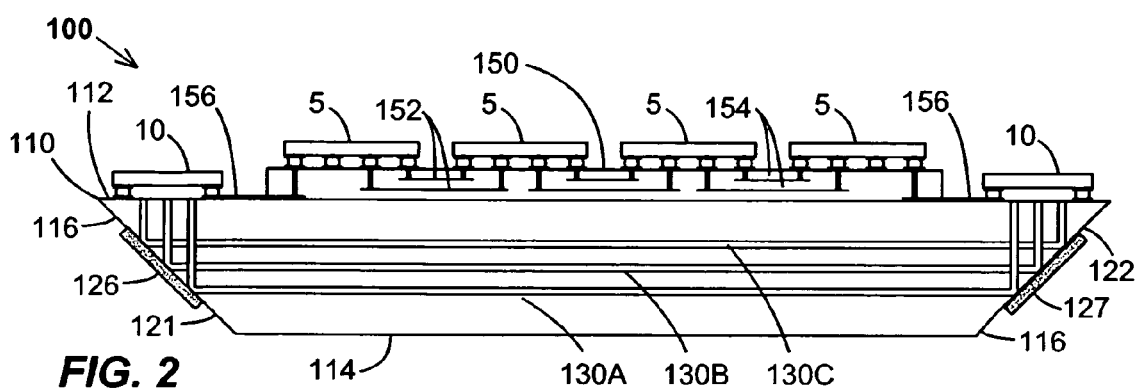
FIG. 2 shows a cross-sectional view of the first exemplary optical-routing board according to the present invention.

A top plan view of a first optical-routing board 100 is shown in FIG. 1, and a cross-sectional view thereof is shown in FIG. 2. Referring to FIG. 1, optical-routing board 100 is for holding a plurality of IC chips 5 disposed in the central area of board 100, and a plurality of opto-electric chips 10 disposed around the periphery of board 100. For visual simplicity, ten IC chips 10 and six opto-electric chips 5 are shown in FIG. 1. In typical applications, there may be tens to hundreds of IC chips 5, and tens of opto-electric chips 10, with the diameter of board 100 being relatively large (e.g., 20 cm to 40 cm). Referring to both FIGS. 1 and 2, optical-routing board 100 comprises a substrate 110 having a top surface 112, a bottom surface 114, and one or more sides 116. Selected IC chips 5, usually those closest to the side(s) 116, are electrically coupled to opto-electric chips 10 by a plurality of electrical traces 156 formed on the substrate's top surface 112. In addition, a plurality of IC chips 5 are electrically interconnected to one another by a network layer 150 comprising a plurality of electrical traces 152 formed within a plurality of dielectric layers 154.

Board 100 further comprises a first beveled surface 121 formed at a side 116, and a second beveled surface 122 formed at a side 116. The beveled surfaces 121 and 122 are beveled with respect to top surface 112, and may be flat (e.g., may be facets), rounded (concave or convex), or a combination thereof. In the example shown in FIGS. 1 and 2, the side is the same for both beveled surfaces since the side is circular, but it may be appreciated that substrate 110 may have a polygonal shape (such as a square, rectangular, or hexagonal shape) and the beveled surfaces may be disposed on different sides. Substrate 110 is preferably formed from a substantially monolithic body of optical material, and is preferably non-laminated (i.e., not formed by laminating layers). Referring to FIG. 1, optical-routing board 100 further comprises a plurality of waveguide cores 130 formed within substrate 110 by a pulsed-laser formation process described below in greater detail. Each waveguide core 130 optically couples one or more opto-electric chips 10 to one another. The material of substrate 110 that immediately surrounds each core 130 acts as a cladding layer, thereby forming a wave-guiding structure. Because of this, we will refer to reference number 130 as being a waveguide as well as a waveguide core. FIG. 1 shows three pairs of chips 10, each pair being oppositely disposed about the center point and coupled by at least one respective waveguide core 130. In the cross-section shown in FIG. 2, there are three exemplary waveguide cores 130A, 130B, and 130C disposed at three different levels within substrate 110. Each of waveguide cores 130A–130C has a first segment extending from the substrate's top surface 112 to a first point on the first beveled surface 121, a second segment extending from the first point to a second point on the second beveled surface 122, and a third segment extending from the second point to the substrate's top surface 112. The optical signal in each of waveguide cores 130A–130C undergoes reflection at the first beveled surface 121 and the second beveled surface 122. When the refractive index of substrate 110 is greater than 1.42, the reflections are facilitated by the physical phenomenon of total internal reflection (100% reflection), assuming an incident angle of 45-degrees for the optical signal. For refractive indices between 1.42 and 1.41, the percentage of reflection decreases from 100% to about 63%, which is a sufficient amount of reflection to practice the present invention. For refractive indices below about 1.41, it is preferable to form reflective layers 126 and 127 on beveled surfaces 121 and 122, respectively, to facilitate the reflection. Layers 126 and 127 typically comprise one or more reflective metals. Of course, reflective layers 126 and 127 may be used in implementations where the refractive index of substrate 110 is greater than about 1.41.

In typical computer systems, there is often a need to convey signals from an IC chip on one end of an interconnect board to an IC chip on the opposite end. This distance is often large, and creates a bottleneck in the processing of information by the system. Waveguides 130 enable optical signals to be conveyed from one side of board 100 to another side in less time and with less dispersion than electrical signals conveyed by electrical traces. Thus, waveguides 130 can be used to advantage in a system using board 100 to reduce the above-described processing bottleneck. As an example, referring to FIG. 1, an electrical signal generated by an IC chip 5 at the left end of board 100 can be electrically coupled to an adjacent opto-electric IC chip 10 by an electrical trace 156, which comprises a light transmitter that converts the electrical signal to a corresponding optical signal. The optical signal is coupled to one of waveguides 130A–130C, which conveys it across board 100 to a light receiver on an opto-electric chip 10 disposed at the opposite end of board 100. The light receiver converts the optical signal back to an electrical signal, which is then conveyed to an adjacent IC chip 5 by another electrical trace.

Figure 3:
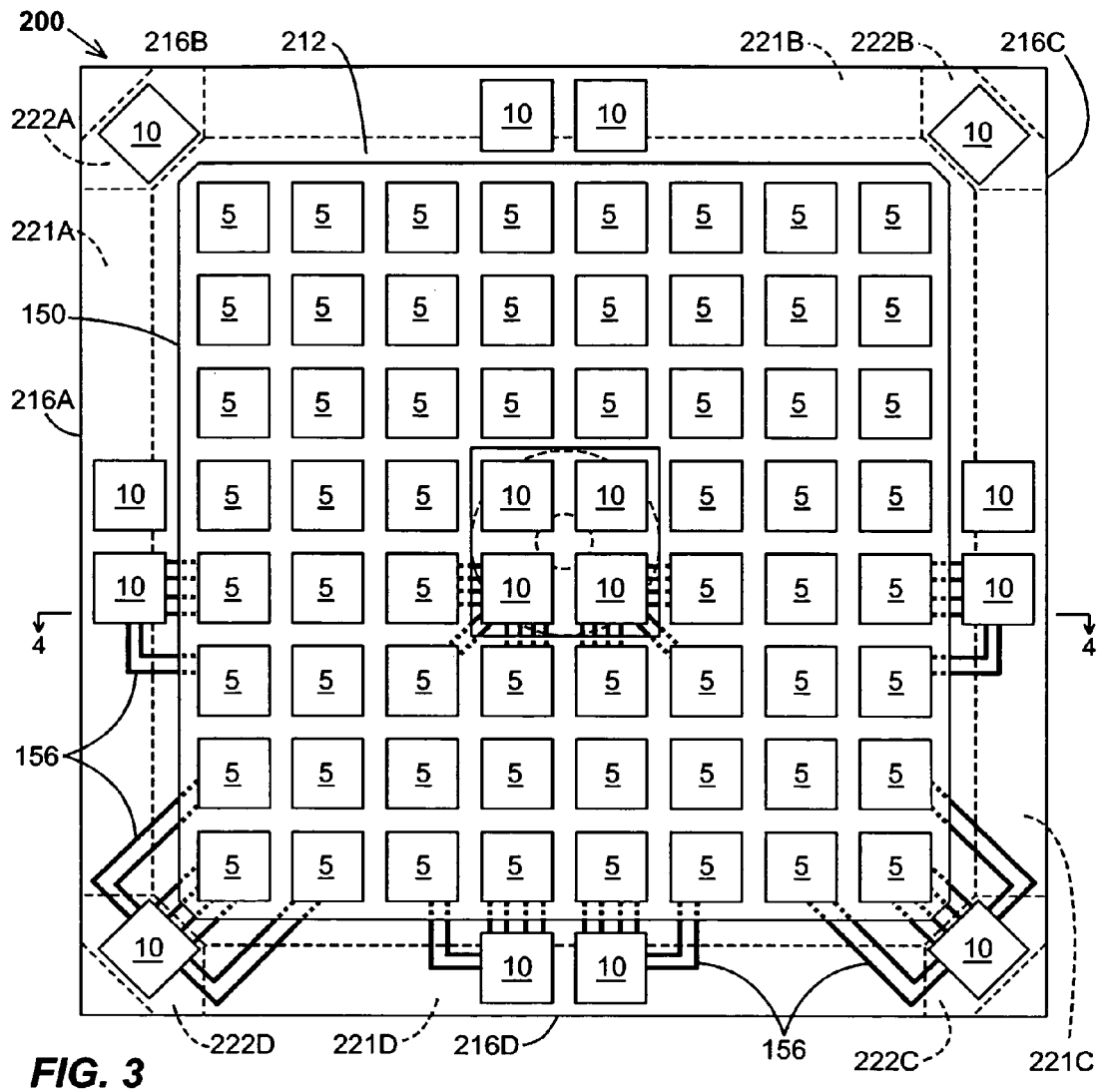
FIG. 3 shows a top plan view of a second exemplary optical-routing board according to the present invention.
Figure 4:
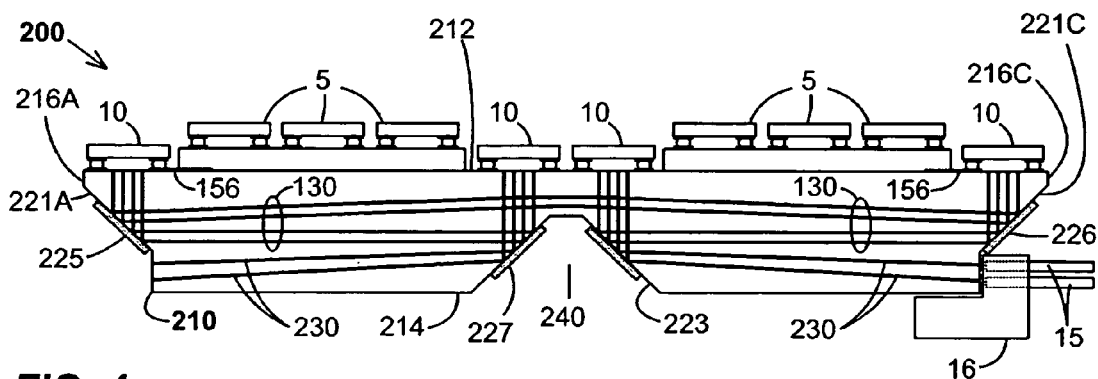
FIG. 4 shows a cross-sectional view of the second exemplary optical-routing board according to the present invention.

A second exemplary optical-routing board 200 is shown in top plan view in FIG. 3, and in cross-sectional view in FIG. 4. Like board 100, optical-routing board 200 is for holding a plurality of IC chips 5 and a plurality of opto-electric chips 10. Four opto-electric chips 10 are disposed at the center of the top surface of board 200, another four are disposed at the corners of the top surface of board 200, and another eight are disposed along the sides of the top surface of board 200. Sixty (60) IC chips 5 are disposed in the central area of the top surface of board 200, surrounding the four opto-electric chips 10 disposed at the center.

Referring to both FIGS. 3 and 4, optical-routing board 200 comprises a substrate 210 having a top surface 212, a bottom surface 214, and four sides 216A–216D. Selected IC chips 5, usually those closest to the sides 216A–216D, are electrically coupled to the opto-electric chips 10 on the periphery by a plurality of electrical traces 156 formed on the substrate's top surface 212. Traces 156 are only shown for a few of these chips for visual clarity in the figures. In addition, the plurality of IC chips 5 are electrically interconnected to one another by a network layer 150 comprising a plurality of electrical traces 152 formed within a plurality of dielectric layers 154. For visual clarity in the figures, only a few of the traces 152 are shown in FIG. 4.

Board 200 further comprises a first plurality of beveled surfaces 221A–221D disposed around the periphery of the board, adjacent to sides 216A–216D, respectively, and a second plurality of beveled surfaces 222A–222D disposed at the corners of board 200. Each of the beveled surfaces may be flat (e.g., may be facets), rounded (concave or convex), or a combination of both. The beveled surfaces are inset toward bottom surface 212, as best seen in FIG. 4. The outlines of the beveled surfaces are shown in dashed lines in the top plan view of FIG. 3. Board 200 further comprises a second plurality of beveled surfaces 222A–222D disposed at the corners of the board 200. Beveled surfaces 222A–222D are inset toward bottom surface 212, and their locations are shown in dashed lines in the top plan view of FIG. 3. Board 200 further comprises a void 240 formed in bottom surface 212 at the center of board 200. Void 240 may comprise one or more sidewalls, and can have the form of a pyramid, a truncated pyramid, a cone, a truncated cone, a hemisphere, a partial sphere, a combination thereof, or any other three-dimensional geometric form. Each sidewall may be flat or non-planar. In the exemplary embodiment shown in FIGS. 3 and 4, void 240 comprises a frustum shape with a top sidewall, a single side sidewall, and a beveled surface 223 formed on the single side sidewall. Each of beveled surfaces 221A–221D, 222A–222D, and 223 form a beveled angle of about 45 degrees with respect to the top surface 214, preferably being within a few degrees of 45 degrees, as measured at the points where the waveguide segments abut the beveled surface. Angles significantly different from 45 degrees can be accommodated by forming curving bends in the portions of the waveguide segments that are adjacent to the beveled surface.

Like substrate 110, substrate 220 is preferably formed from a substantially monolithic body of optical material, and is preferably non-laminated (i.e., not formed by laminating layers). Referring to FIG. 4, optical-routing board 200 further comprises a plurality of waveguides 130 formed within substrate 210 by a pulsed-laser formation process described below in greater detail. Each waveguide core 130 optically couples one or more opto-electric chips 10 to one another, in the manner previously described above. In addition, board 200 comprises another plurality of waveguide cores 230 formed within substrate 210 by pulsed-laser formation. Waveguide cores 230 route optical signals from the centrally-disposed opto-electric chips 10 to the sides 216A–216D, where they may be coupled to external optical fibers 15 by way of fiber mounts 16. The external optical fibers 15 can convey optical signals to and from board 200, as needed according to the particular application for which board 200 is used.

Each of waveguide cores 130 has a first segment extending from the substrate's top surface 212 to a first point on one of beveled surfaces 221–223, a second segment extending from the first point to a second point on another one of beveled surfaces 221–223, and a third segment extending from the second point to the substrate's top surface 212. The optical signal in each of the waveguide cores 130 undergoes reflection at the beveled surfaces. As previously described, for refractive indices of substrate 210 that are below about 1.41, it is preferable to form reflective layers 225, 226, and 227 on surfaces 221, 222, and 223, respectively, to facilitate the reflection, as shown in FIG. 4. Reflective layers 126 and 127 typically comprise one or more reflective metals. Of course, reflective layers 226–227 may be used in implementations where the refractive index of substrate 210 is greater than about 1.41. Each of waveguide cores 230 has a first segment extending from the substrate's top surface 212 to a point on a beveled surface 223, and a second segment extending from this point to one of sides 216A–216D, where it can be coupled to an external optical fiber 15 by way of a fiber mount 16.

Opto-electric chips 10 have light receivers and light transmitters disposed on their main surfaces (which are oriented to face substrate 210) as needed by the particular system application using board 200. Each light receiver and each light transmitter has an optical surface that may be substantially aligned to either the first or third segment of a waveguide core 130 to couple light therewith, or may be substantially aligned to the first segment of a waveguide core 230 to couple light therewith. Electrical traces 156 electrically couple the electrical outputs of the light receivers to corresponding electrical inputs of electrical circuits on IC chips 5, and also electrically couple the electrical inputs of the light transmitters to corresponding electrical signals generated by electrical circuits on opto-electric IC chips 10. As in the case of board 100, waveguides 130 can be used to advantage in a system using optical-routing board 200 to reduce processing bottlenecks within the system. Waveguides 230 can be used to advantage by enabling optical inputs and outputs to the system.

Figure 5:
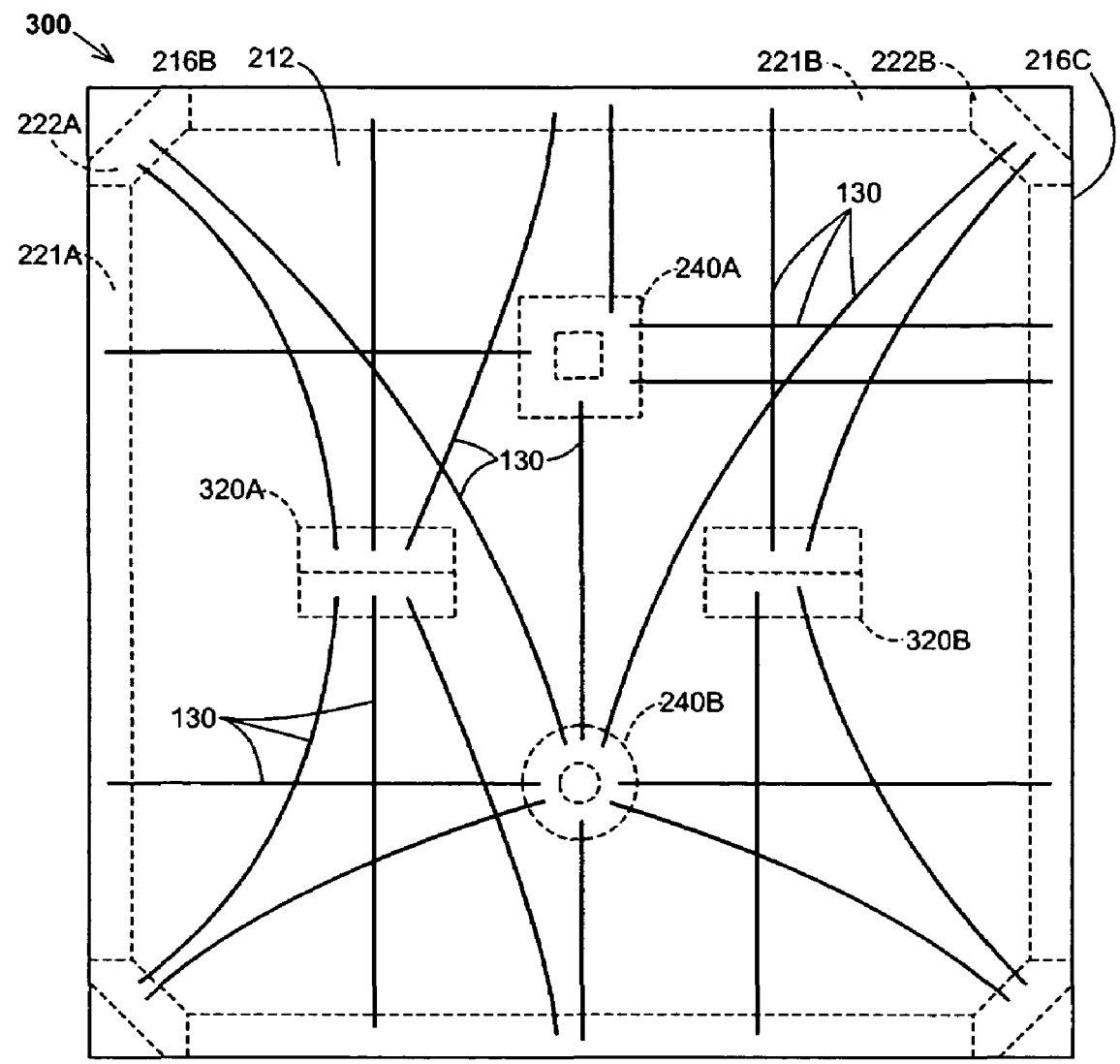
FIG. 5 shows a top plan view of a third exemplary optical-routing board according to the present invention.

While one void 240 with corresponding surface(s) 223 has been shown in the example in FIGS. 3 and 4, it may be appreciated that an optical board according to the present invention can have a plurality of voids 240 with respective beveled surfaces. In addition, an optical board according to the present invention may have beveled surfaces like 221A–221D formed within the interior of the board rather than on the periphery, using what may be called "groove beveled surfaces." FIG. 5 shows a top plan view of an exemplary board 300 that comprises two voids 240A and 240B with corresponding beveled surfaces, and two interior groove beveled surfaces 320A and 320B. Void 240A comprises a shape of a truncated pyramid, and void 240B comprises a shape of a truncated cone. Also in FIG. 5, we show a plurality of exemplary waveguides 130 that may be used to route optical signals between groove beveled surfaces 320 and side beveled surfaces 221 and corner beveled surfaces 222, and to route optical signals between beveled surfaces of voids 240 and side beveled surfaces 221 and corner beveled surfaces 222. As can be seen in the figure, the horizontal segments of the waveguides may be straight or curved.

Figure 6:
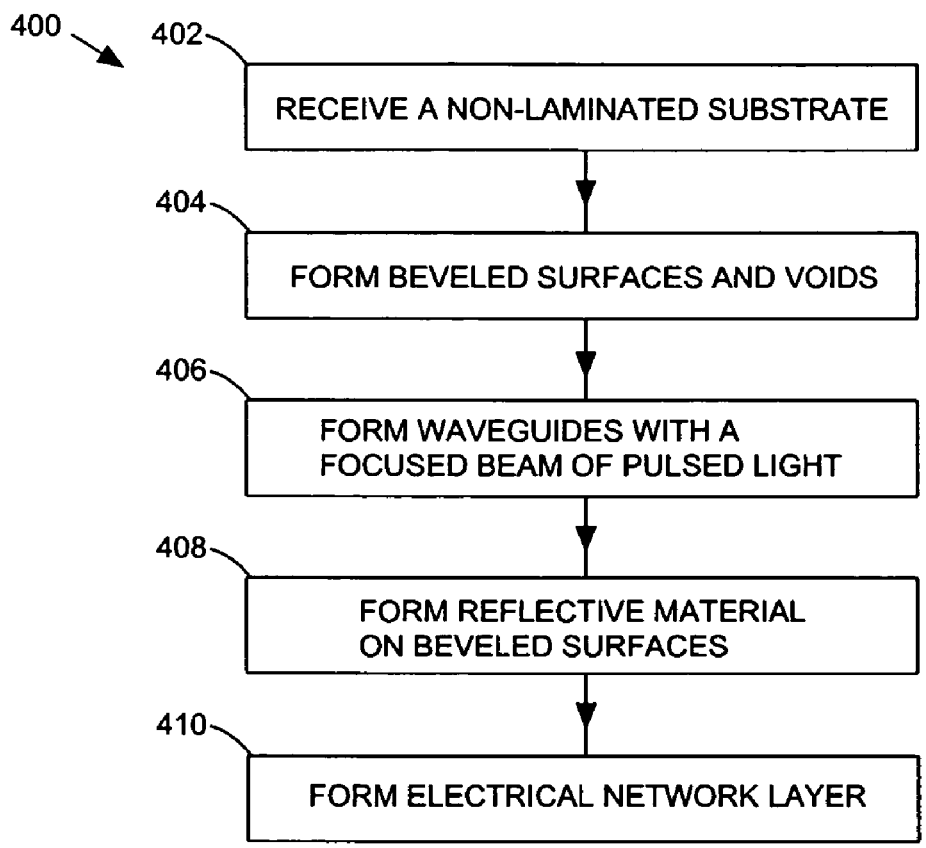
FIG. 6 is a flow diagram illustrating an exemplary method of manufacturing optical-wiring boards according to the present invention.

FIG. 6 is a flow diagram 400 illustrating an exemplary method of manufacturing optical-wiring boards according to the present invention. As illustrated at block 402, the method preferably starts by receiving an initial non-laminated substrate of optical material that has the same size and shape as that desired for the optical-wiring board, or slightly larger. The initial substrate is at least moderately optically transparent (i.e., has an attenuation factor of less than 3 dB per centimeter) at the wavelength of the pulsed laser, and substantially optically transparent (i.e., has an attenuation factor of less than 0.2 dB per centimeter) at the wavelength of the optical signals used in the waveguides of the system (generally between 900 nm 1600 nm, with 1300 nm and 1550 nm being common values). The initial substrate preferably comprises a monolithic body of optical material. The optical material preferably comprises a form of glass, such as soda-lime glass, lead glass, borosilicate glass, and other types of silica glasses.

As a next step of the exemplary method, as illustrated at block 404 in FIG. 6, the beveled surfaces and voids (if used) are formed in the substrate. Various processes of micromachining and polishing known to the art may be used form the voids and beveled surfaces. For example, milling may be used to roughly cut the voids and beveled surfaces, and various polishing processes may be used to provide smooth surfaces and well-defined dimensions to the beveled surfaces (which may be located on the substrate sides and/or the sidewalls of the voids). In addition, the initial substrate may be formed by a molding process that forms the voids and beveled surfaces, either to rough dimensions or to sufficiently precise dimensions for the desired application. In the former case, micromachining and/or polishing processes may be used to provide the final dimensions of the finished substrate.

To provide good reflecting properties at the beveled surfaces for the waveguide cores, the waveguide cores are preferably formed such that the ends of their horizontal and vertical segments meet at the beveled surfaces to within a tolerance of two to five microns. This can be achieved with a number of approaches. One approach includes one or more alignment marks on the initial substrate and micromachining and/or polishing equipment that has precision alignment capability and computer-numerically-controlled (CNC) machining and/or polishing tools. The initial substrate is mounted to a stage or holder of the equipment with the substrate's alignment marks aligned to corresponding alignment marks of the equipment. A dimensional description of the desired dimensions of the finally-cut substrate is loaded into the equipment's computer. The dimensional description specifies the desired dimensions of the voids and beveled surfaces relative to the alignment mark for the finally-cut substrate. A starting dimensional description for the initial substrate is also usually given so that the equipment may limit the amount of material removed in the rough cutting steps to a degree that does not cause undesirable chipping or tool distortion. With this in place, the equipment can proceed to mill and/or polish the voids and beveled surfaces to be within the preferred tolerances of two to five microns.

In another approach, the voids and beveled surfaces are formed in the initial substrate, such as by simple mold casting, and the dimensions of the substrate, voids, and beveled surfaces are measured by three-dimensional mapping equipment available in the art. The measurements are made with respect to one or more reference points formed on the substrate. These reference points may be alignment marks formed on the top and/or bottom surfaces of the substrate, or may be one or more corners of the substrate (if it is not round). The bottom surface of the substrate is usually mapped since the voids and beveled surfaces are generally best seen when looking at the bottom surface. The top surface may be mapped as well to assess its planarity. The mapping information is stored in a form that can be input to the waveguide writing equipment, which is described below in greater detail. Such a form may comprise a computer-readable medium. Of course, the first and second approaches may be combined, if desired. For example, the finally-cut substrate may be milled and/or polished by the CNC equipment, and then the finally-cut substrate may be mapped by the three-dimensional mapping equipment.

As a next step of the exemplary method, as illustrated in block 406 in FIG. 6, waveguide cores are formed in the finally-cut substrate by a laser emitting a focused beam of pulsed light having pulse durations of less than 100 femto-seconds. A piece of laser-writing equipment is provided for this, an example of which is schematically illustrated at 500 in FIG. 7 and described below in greater detail. For example, in forming a first exemplary waveguide core, a first waveguide-core segment is formed in the substrate using pulsed laser light having a pulse duration of less than 100 femto-seconds per pulse such that the first waveguide-core segment has a first end disposed substantially at a beveled surface at a first point, and a second end disposed away from the first point. Pulses having duration equal to or less than 60 femto-seconds are generally preferred. A second waveguide-core segment is then formed in the substrate using the pulsed laser light such that the second waveguide-core segment has a first end disposed substantially at the first point and a second end disposed away from the first point. The second end of the first waveguide-core segment may be disposed near or at the top surface of the substrate, and the second end of the second segment may be disposed near a side of the substrate, or at a second beveled surface located on a side of the substrate or on a sidewall of a void formed in the substrate. Alternatively, the locations of the second ends of the first and second waveguide cores may be reversed. Additional waveguide cores may be similarly formed.

As described below in greater detail, laser-writing apparatus 500 receives a dimensional description of the substrate and a list of the waveguide cores to write, which includes a specification of the coordinates of their segments, as referenced to one or more alignment points on the substrate's surface. The coordinates of waveguide-core segments fall within in the ideal dimensional description of the substrate, and should preferably be within the dimensions of the actual substrates, particularly at the beveled surfaces where the direction of propagation in the waveguide is to change. However, there will be deviations in the actual substrates from the ideal specifications. Nonetheless, some deviation is permitted at the beveled surface since the light tends to move toward the higher index material. In those cases where the dimensional description of an actual substrate is derived from a mapping of the substrate by a piece of three-dimensional mapping equipment, one may take the additional step of adjusting the coordinate specifications of the waveguide cores to match the beveled surfaces of the substrate, thereby increasing the accuracy of the matching of the core ends to the beveled surfaces.

As a next step in the exemplary methods, as illustrated at block 408, reflective material can be formed on the beveled surfaces to increase the degree of reflectivity. This may be accomplished by masking the locations where reflective material is not to be formed, followed by material deposition. The masking may be accomplished by fitting respective preformed covers over the top and bottom surfaces of the substrate (much like a plastic lid that fits over the mouth of a can), with apertures cut out in the locations of the voids and beveled surfaces. The material deposition may be accomplished by sputtering, PVD, or other metal deposition processes known to the art.

As a next step in the exemplary methods, as illustrated at block 410, electrical network layer 150 is formed. This may be readily accomplished by a buildup of interleaved dielectric and metal layers by processes known to the circuit board art. This step forms the electrical traces 156 that will electrically interconnect the IC chips 5 with the opto-electric device chips 10. During this step, care is taken not to form electrical traces over the locations where optical signals will be conveyed through the top surface of the substrate. The formation of network layer 150 is preferably aligned to the same alignment marks used to align the substrate to the pulse-laser writing equipment. In this way, the vertical segments of the waveguide can be readily aligned to the electrical interconnects for the opto-electric chips 10. From this step, the substrate may be used in the desired application by populating the substrate with chips 5 and 10.

An exemplary laser-writing apparatus is schematically illustrated at 500 in FIG. 7. Apparatus 500 comprises a pulsed-laser writing tool 540 that focuses a pulsed-laser beam at a distance L in front of it, toward the substrate that is to be written on. The focal distance is typically a fixed distance. Pulsed-laser writing tool 540 is held in a fixed position relative to X-Y-direction stage 530 by one or more support members (not shown in the figure). Apparatus 500 further comprises a mount 510 that holds the substrate below pulsed-laser writing tool 540, and a Z-direction stage 520 that moves mount 510 in the vertical direction relative to pulsed-laser writing tool 540, and that preferably can rotate the substrate by at least 10 degrees about a vertical axis (although such is not strictly necessary). The movement is directed by computer (such as computer 580 described below). Typically, the vertical movement of Z-Stage 520 can be stepped in increments of 1 to 2 microns or less, and the rotational movement can be stepped in increments of 0.1 degrees or less. Conventional stepping motors and gear arrangements may be used to provide the Z-direction motion and the angular rotation. Z-stage 520 measures its vertical distance with respect to an arbitrary reference point, and updates a data register with the current vertical distance each time the stage is moved. The updating can be done by moving the stage in its minimum step increments, and either incrementing or decrementing the data register by one with each step, depending upon the direction of motion. Conventional position detectors may be used for this measurement. The data register can be read by a computer (such as computer 580 described below). The value in the data register is referred to as the Z-coordinate of Z-direction stage 520. In preferred embodiments, Z-direction stage 520 can set the arbitrary reference point to any value upon command by a computer. This is typically done by allowing the computer or a human operator to move stage 520 to a desired point, and then issuing a command to stage 520 to set the value of the register to a provided value (usually zero).

Apparatus 500 further comprises an X-Y-direction stage 530 that moves the substrate, mount 510, and Z-direction stage 520 in the horizontal X and Y directions relative to pulsed-laser writing tool 540. As one implementation, a first array of selectively energizeable magnetic elements are embedded in the top surface of stage 530, and a second array of magnetic elements are embedded in the bottom surface of Z-stage 520. The second array may be static or selectively energizeable. Typically, the horizontal movement of stage 530 can be stepped in increments of 1 to 2 microns or less under computer control (such as computer 580 described below). X-Y-direction stage 530 measures its location in the X and Y directions relative to an arbitrary reference point on the top surface of X-Y stage 530. Stage 530 updates two data registers with the current X and Y locations each time the stage is moved. The updating can be done by moving the stage in its minimum step increments, and incrementing or decrementing the data registers with each step, depending upon the direction of motion. The data registers can be read by a computer (such as computer 580 described below). The values in the data registers are referred to as the X- and Y-coordinates of X-Y-direction stage 530. In preferred embodiments, X-Y stage 530 can set the arbitrary reference point to any value upon command by a computer. This is typically done by allowing the computer or a human operator to move stage 530 to a desired point, and then issuing a command to stage 530 to set the value of the registers to a provided value (usually zero for both X and Y).

As described below in greater detail, in exemplary writing methods an operator is allowed to move stages 520 and 530 in their respective ranges of motion to align the substrate to pulsed-laser writing tool 540. Once aligned, a computer writing program issues commands to stages 520 and 530 to move them through a sequence of motions that enable pulsed-laser writing tool 540 to form a plurality of waveguides according to a list provided to it. In more sophisticated embodiments, the alignment steps provided by the operator may be done by a computer program that incorporates vision recognition technology to recognize and measure alignment marks and/or reference points on the substrate.

While exemplary implementations for stages 520 and 530 have been described above, it may be appreciated that various linear actuators, stepper motors, and gearing arrangements known to the art may be used to implement stages 520 and 530, with combinations of components 510, 520, and 530 being commercially available as one unit (often called XYZ-stages).

Pulsed-laser writing tool 540 comprises a pulsating laser 542, a focusing lens 544 disposed in front of the output of laser 542, and a combination spacing and sealing element 546 that fixes the distance between lens 544 and laser 542, and that prevents material from entering the spaces between the two. Laser 542 provides a pulsating output of laser light of relatively large width, and generally in the ultraviolet wavelength range. The time duration of the laser pulses is generally less than 100 femto-seconds, typically less than 60 femto-seconds, and preferably on the order of 30 femto-seconds or less. The wide beam width of the laser light causes each light pulse to have a relatively low energy density, and the low energy density is not sufficient to alter the refractive index of the substrate material when the pulses strike it. Laser 542 can be positioned vertically or horizontally or detached from the main body of the writing tool 540. In these cases, adequate lenses and mirrors arrangements can be housed and positioned near and/or within the compartment formed by sealing element 546 to form an optics system in order to direct the pulsed laser beam to the focusing lens 544. Lens 544 focuses the light beam, causing the beam width to shrink to a minimum none-zero value at a focal point in front of lens 544. These causes the energy density of each pulse to increase dramatically at the focal point since the same amount of energy is being concentrated into a smaller width. Non-linear light effects within the material of the substrate occur that cause the energy to be absorbed by the material when it is presented at a high energy density, but not to be substantially absorbed at the low energy density (which occurs away from the focal point). Thus, the light pulse is substantially absorbed at the focal point, causing significant heat to be generated at the focal point. The heat is sufficient to cause a softening or melting of the material at the focal point, which then quickly solidifies in a modified form shortly after the end of the pulse. The modified form usually comprises a densification and/or a redistribution of the constituent atoms (including impurities) in the material at the focal point, which in turn causes the refractive index to increase at the focal point. A redistribution of constituent atoms includes changes in the microstructure of the atoms (i.e., how the atoms are arranged with respect to one another), and a non-uniform distribution of one or more constituent atoms between the core and the substrate material immediately adjacent to the core (e.g., changes in relative amounts of the atoms). Thus, the material of the core is different from the substrate's bulk material surrounding it in at least one of the respects of density, distribution of constituent atoms, and relative amounts of constituent atoms.

To write a waveguide, the substrate is moved relative to the focal point of the pulsed light by stages 520 and 530, generally moving at a rate that allows several thousand to tens of thousands of pulses to be absorbed per centimeter of motion. During the writing process, an index-matching fluid 505 is preferably disposed over the top surface of the substrate and up to the level that lies above lens 544. The refractive index of fluid 505 is selected to be relatively close to that of the substrate (generally within 5%, preferably within 2%). Without fluid 505, the distance L of the light's focal point would undergo a second-order variation as the substrate is moved in the vertical direction due to Snell's law and a step-change of refractive index at the top surface of the substrate. Seal 546 prevents fluid 505 from entering the space between laser 542 lens 544, the action of which would cause distortion of the beam and changes in the focal point. Also, an outer dam 508 is disposed around the side(s) of the substrate to contain fluid 505. Dam 508 may be part of mount 510, or may comprise a preformed element that is pressed onto the sides of the substrate and held there by a temporary adhesive/sealant.

The second-order variation in the focal point can be computed in real-time, and the Z-motion of the substrate can be varied to account for it. Thus, the use of fluid 505 is not strictly necessary.

Z-stage 520, X-Y direction stage 530, and pulsed-laser writing tool 540 are under the control of a computer 580 that receives the dimensional description of the substrate and a list of the waveguides to write, which includes a specification of the coordinates of their segments, as referenced to one or more reference points (e.g., alignment marks) on the substrate's surface. The coordinates of the reference points are also provided, in either the dimensional description or the waveguide listing. Computer 580 turns laser 542 on and off (e.g., blanking upon retrace), and controls the motion of stages 520 and 530 to produce the list of waveguides to the specifications of their segment coordinates. A user interface is coupled to computer 580 to enable a human operator to direct computer 580 to receive the dimensional description of the substrate and the list of waveguides, and to direct computer 580 to start the waveguide-writing process. The user interface may have a standard keyboard or array of buttons with commands indicated thereon for this purpose. In addition, in the case where the operator aligns the substrate or alignment plate to pulsed-laser writing tool 540 (as described below in further detail), the user interface receives commands from the operator for moving stages 520 and 530. For this purpose, the user interface may comprise a joy-stick (for receiving X-Y motion commands) and a rocker switch with momentary-contact action (for receiving Z-motion commands).

Apparatus 500 preferably includes an optical alignment tool 550 that has a capability of viewing the top surface of the substrate (X-Y plane), where alignment fiducials can be deposited before the formation of the beveled surfaces. The view plane of alignment tool 550 is at a known distance $D_V$ below the tool at a point which is referred to herein as the system reference point $P_{REF}$. The known distance $D_V$ may be set as the focal point of the optical viewing system of tool 550, or may be measured by a distance measuring tool incorporated into tool 550, with the distance measuring tool using any number of measurement techniques (e.g., interferometry). Optical alignment tool 550 has an internal X-Y crosshair reference mark that it uses to align to the substrate's reference points. The substrate's reference points generally comprise a form of a crosshair, and virtually all forms of such crosshairs can be visually correlated and aligned to the X-Y crosshair reference mark of tool 550. Tool 550 provides to a TV monitor an image focused at the system reference point $P_{REF}$, with the X-Y crosshair reference mark superimposed on the image, for an operator to see. The operator may then adjust stages 520 and 530 to bring the top surface of the substrate into view of this image (i.e., into the optical focal point of tool 550 at $P_{REF}$), and to move the substrate around to bring any one of the substrate's alignment marks into view and alignment with the X-Y crosshair reference mark of tool 550. Alignment tool 550 may be mechanically coupled to pulsed-laser writing tool 540 (as shown in the figure) or integrally formed therewith, but such coupling is not necessary.

As indicated above, the list of waveguides specifies the coordinates of the waveguide segments relative to one or more reference points located on the substrate's surface. The 'coordinate system defined by the substrate's reference marks is different from the apparatus' coordinate system defined by the X-, Y-, and Z-registers of stages 520 and 530. One goal of an alignment process is to find the mapping between these two coordinate systems, taking into account that mount 510 is moved around during the writing process. Another goal of an alignment process is to find the coordinates of the laser's focal point in the apparatus' coordinate system. Given this information, it is a straightforward process to convert the coordinates of each waveguide to coordinates within the apparatus' coordinate system, and to move stages 520 and 530 such that the waveguide segments are traced through the location of the laser's focal point.

Many alignment procedures may be used, and an exemplary one is described here. In this procedure, the focal point of optical alignment tool 550 is used as the apparatus' origin of its X, Y, and Z coordinate system. This point is designated as $P_{REF}$ in FIG. 7. In addition, the center point of the top surface of mount 510 is marked with an alignment mark, which is labeled as CP in FIG. 7. As a first step, without a substrate disposed on mount 510, the operator (or computer 580 using vision-recognition technology) moves stages 520 and 530 such that center point CP of mount 510 is positioned at the apparatus' origin $P_{REF}$. This will be shown in the TV monitor as a sharp image of the alignment mark at center point CP. The depth of field of typical optical systems found in alignment tools such as tool 550 can be as small as 1 to 4 microns. This is generally sufficient accuracy for practicing the present invention. Instructions are then given to zero the X- and Y-registers of stage 530 and the Z-register of stage 520. This step is a machine-calibration step that aligns the center point CP of mount 510 to the apparatus' origin $P_{REF}$ when the X-, Y-, and Z-coordinates are at zero. Thus, as stages 520 and 530 are moved around, center point CP will lie at the X-, Y-, and Z-coordinates indicated by the data registers of the stages. If one uses a tool 550 with an optical system having depth of field greater than 4 microns, an accurate distance-measuring tool may be incorporated into tool 550 to enable the operator (or computer) to set stage 520 to distance $D_V$ with greater accuracy before zeroing the Z-register. If the registers do not have the capability of being set to zero, then one may read the values of the registers and store them as offsets in the control software. The control software may then subtract these offsets from the register values each time it reads them.

As another machine-calibration step, the displacement vector $V_{PF}$ between the focal point of the pulsed laser light and the apparatus' origin $P_{REF}$ is determined. An exemplary way of doing this is described below. With this vector, the position of the laser's focal point in the apparatus' coordinate system, which is designated herein as $P_{FP}$, can be related to the origin $P_{REF}$ as follows: $P_{FP}=P_{REF}+V_{PF}$. This value can be further verified by computing displacement vector $V_{PF}$ with geometry using the specified focal length of the focusing lens 544 and the machine's specifications on location of alignment tool 550 and lens 544. With these machine-calibration steps done, several substrates may be aligned and processed by apparatus 500 before the machine-calibration steps have to be redone. However, these machine-calibration steps may also be performed before aligning and processing each substrate.

Figure 8:
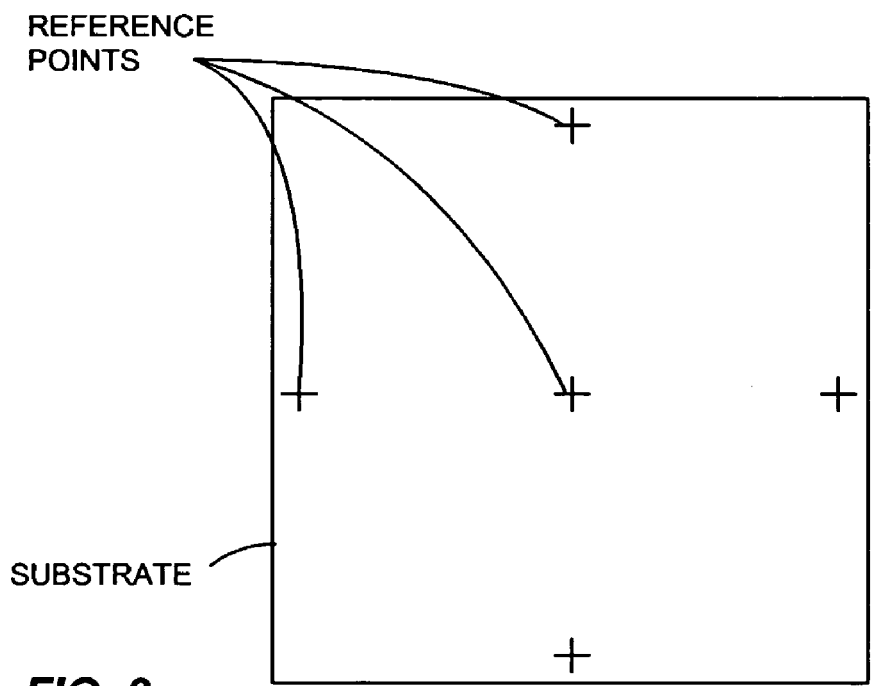
FIG. 8 shows top plane view of an exemplary substrate with reference points according to the present invention.

As a next step, stage 520 is lowered and moved to one side to allow the operator to place a substrate (with dam 508 in place) on the top surface of mount 510. The substrate may be held on mount 510 by a plurality of vacuum ports formed in mount 510 according to conventional practice. As a next step, the operator moves stages 520 and 530 such that one of the substrate's reference points is placed at the apparatus' origin $P_{REF}$, as determined by its alignment to the reference crosshairs of alignment tool 550 (for X and Y alignment) and a clear image of the reference point in the TV monitor (for Z alignment). This is preferably done prior to disposing index-matching fluid 505 over the top surface of the substrate. FIG. 8 shows a top plan view of an exemplary substrate with its reference points. At this point of the alignment, the X-, Y-, and Z-registers of stages 520 and 530 hold the values of a displacement vector that originates at center point CP and terminates at the substrate reference point being processed. The register values are read and stored as the displacement vector from center point CP to the reference point. One or more substrate reference points are similarly processed. This produces a set of displacement vectors from center point CP to two or more of the substrate reference points. With these displacement vectors, a mapping function can be created by conventional application of geometry to allow the coordinates of the waveguides in the list to be referenced to center point CP. Such can be done by one of ordinary skill in the art without undue experimentation.

With this data, a computer control program running on control computer 580 can then move stages 520 and 530 through a series of points while the laser 542 is emitting pulsed light to form the waveguides (with index-matching fluid 505 being disposed over the substrate before writing). Using the mapping function, the program constructs a series of points for each waveguide, each point being referenced to center point CP and having a corresponding vector $V_i$ from center point CP to it. Then, to place that point at the focal point of the laser light, stages 520 and 530 are moved such that the X, Y, and Z registers contain a value equal to $(-V_i+V_{FP})$. The points of the waveguide are moved into the focal point in sequential order, and laser 542 is blanked when stages 520 and 530 have to be moved to start the writing of the next waveguide in the list.

Figure 9A:
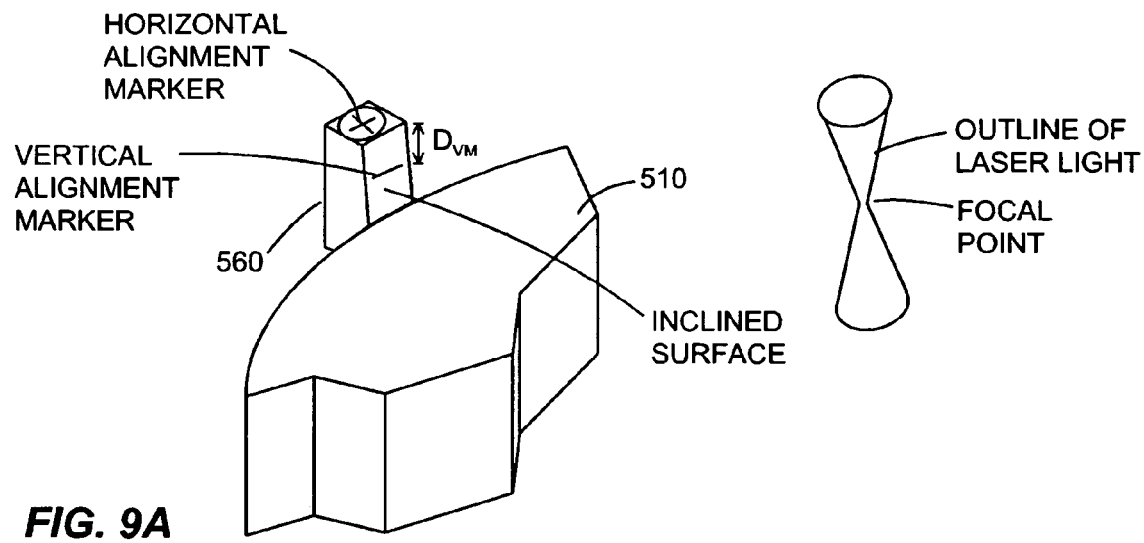
FIGS. 9A–9C are perspective views of a laser alignment tool in various stages of use according to the present invention.

As we mentioned above, the displacement vector $V_{PF}$ between the focal point of the pulsed laser light and the apparatus' origin $P_{REF}$ is determined during one of the machine-calibration steps. This may be accomplished with the aid of calibration tool 560, which is attached to the side of mount 510 near its top surface (left side of mount 510 in FIG. 7). A close-up perspective view of tool 560 is shown in FIG. 9A. Tool 560 comprises an elongated body with an inclined surface, a horizontal alignment marker on the top surface of the elongated body, and a vertical alignment marker disposed on the inclined surface at a known distance $D_{MV}$ below the top surface. The inclined surface is very steep, and generally forms an angle of more than 90 degrees with the top surface of mount 510, but less than about 110 degrees (i.e., within 20 degrees of the normal vector to the top surface of mount 510). The horizontal marker comprises a circle and a crosshair disposed at the center of the circle.

The top surface and inclined surface of tool 560 are preferably painted with a luminescent paint that is responsive to the wavelength of the laser light and that has a short decay time (less than a few seconds).

Figure 9B:
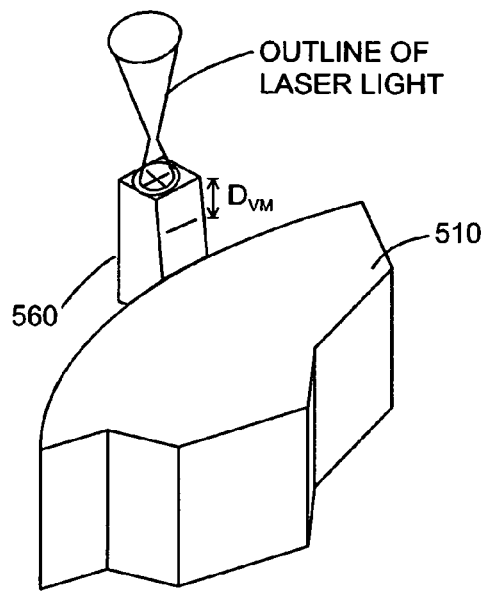
Figure 9C:
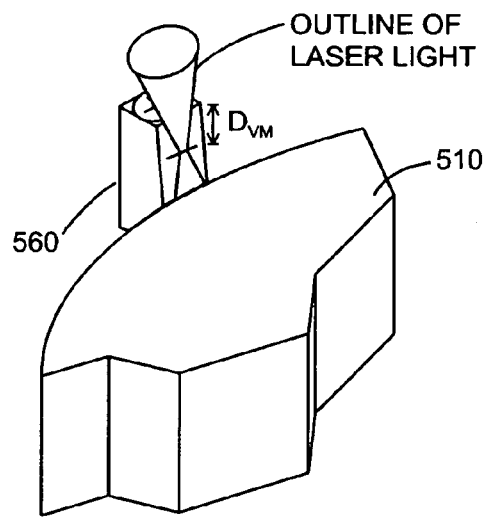

After the first machine-calibration step has been performed (that of zeroing the stage's registers with the mount's center point CP at the apparatus' origin $P_{REF}$), the operator moves the stages such that the focal point of alignment tool 550 is aligned to the crosshairs of tool 560's horizontal alignment marker. An oblique-view vision tool 570 may be used to provide the operator with a view of the area around the focal point of the laser light. Tool 570 provides a magnified image to a TV monitor. Tool 570 is held in a fixed relationship to laser writing tool 540, but can be adjusted by hand through small angular and translational ranges of motion in order to bring the desired image into view. With this done, the X-, Y-, and Z-registers of the stages are read, and these values are saved as a vector (Ax, Ay, and Az). Next, the stages are moved such that the cross-section of the laser light from laser 542 (FIG. 7) falls within the circle of the horizontal alignment marker of tool 560 and is concentric to its center, as shown in FIG. 9B. Again, oblique-view vision tool 570 is used to provide the operator a view of the laser's focal point. The stages are located such that the focal point of the laser's light beam is either above or below the top surface of tool 560 to prevent damage to the luminescent paint (alternatively, laser 542 may be equipped with an optical attenuator that can be selectively switched into the optical path above lens 544). Otherwise, exact alignment in the Z-direction is not needed. At this point, the data registers of X-Y-direction stage 530 are read for the X and Y coordinates, and stored as values Bx and By. Next, the operator moves X-Y direction stage 530 such that the laser light strikes the inclined surface of tool 560. The X and Y values are then adjusted so that the width of the focal point appears with a maximum value somewhere on the inclined surface. Then, the operator moves the Z-direction stage 520 such that the vertical alignment marker on the inclined surface crosses the focal point, as shown in FIG. 9C. These two adjustment steps are generally reiterated for greater accuracy. At this point, the data register of Z-direction stage 520 is read for the Z coordinate, and stored as value Bz. The displacement vector $V_{PF}$, as measured in air, may then be computed as:

$$V^A{}_{PF}=(Bx-Ax, By-Ay, Bz-D_{MV}-Az),$$

where the subscript "A" denotes that the vector is for the case where the laser light is in air, which has a refractive index of 1. As is known in the art, a higher index of refraction (such as found in the index-matching fluid and the substrate) will cause the focal point to move further away from lens 544. Thus, the Z-direction component must be corrected to account for the higher index of refraction. For the plano-convex lens form of lens 544 shown in FIG. 7, this correction is as follows:

$$V_{PF}=(Bx-Ax, By-Ay, \{n_M \cdot [Bz-D_{MV}-Az+dL]-dL\}),$$

where $n_M$ is the index of refraction of the substrate and index-matching fluid 505, and where dL is the spacing distance in the vertical direction between the outer lens face of lens 544 and the focal plane of optical alignment tool 550, as shown in FIG. 7.

The distance dL can be measured in a one-time measurement step by conventional height measuring techniques. For example, a leaf-spring may be mounted on a substrate, and the substrate mounted to mount 510. Then stages 520 and 530 may be moved to position a flat spot of the leaf-spring into the view of tool 550. The Z-coordinate register of stage 520 is then zeroed. Stages 520 and 530 are then moved to place the leaf spring under lens 544, and stage 520 is moved up until a motion in the spring is detected (such as by tool 570). The Z-coordinate register of stage 520 is then read, and the absolute value of this register is value dL.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An optical-routing board comprising:
    a non-laminated substrate having a top surface, a bottom surface, and one or more sides;
    a first beveled surface formed at a side of the substrate;
    a second beveled surface formed at a side of the substrate;
    a waveguide core formed within said non-laminated substrate having a first segment extending from the substrate's top surface to a first point on the first beveled surface, a second segment extending from the first point to a second point on the second beveled surface, and a third segment extending from the second point to the substrate's top surface.

2. The optical-routing board of claim 1 wherein the substrate comprises a bulk material whose density and or distribution of constituent atoms may be varied by exposure to pulsed laser light, and wherein the waveguide core is formed by exposure to pulse-laser light such that the material of the core is different from the substrate's bulk material in at least one of the respects of density, distribution of constituent atoms, and relative amounts of constituent atoms.

3. The optical-routing board of claim 1 further comprising reflective material disposed on each of the first and second beveled surfaces.

4. The optical-routing board of claim 1 further comprising:
    a third beveled surface formed at a side of the substrate; and
    an additional waveguide core formed within said non-laminated substrate, the additional waveguide core having a first segment extending from the substrate's top surface to a third point on the first beveled surface, a second segment extending from the third point to a fourth point on the third beveled surface, and a third segment extending from the second point to the substrate's top surface.

5. The optical-routing board of claim 1 further comprising a plurality of electrical traces formed above the substrate's top surface.

6. The optical-routing board of claim 1 wherein the board is for least routing optical signals of a first wavelength, the first wavelength being within the range of 900 nm to 1600 nm, and wherein the substrate comprises material that is substantially transparent to light at the first wavelength.

7. An optical-routing board comprising:
    a non-laminated substrate having a top surface, a bottom surface, and at least one side;

a first void formed in the bottom surface of the non-laminated substrate, the first void having as least one sidewall;

a waveguide core formed within said non-laminated substrate having a first segment extending from the substrate's top surface to a first point on the at least one sidewall of the first void, a second segment extending from the first point to a second point on the at least one side of the substrate.

8. The optical-routing board of claim 7 wherein the non-laminated substrate has a second side, and wherein the optical routing board further comprises an additional waveguide core formed within said non-laminated substrate, the additional waveguide core having a first segment extending from the substrate's top surface to a third point on the at least one sidewall of the first void, and a second segment extending from the third point to a fourth point on the second side of the substrate.

9. The optical-routing board of claim 8 further comprising a beveled surface formed at the second side of the substrate.

10. The optical-routing board of claim 7 wherein a beveled surface is formed at the at least one side of the substrate, and wherein the waveguide core further comprises a third segment extending from the second point to the substrate's top surface.

11. The optical-routing board of claim 7 wherein the substrate comprises a bulk material whose density and or distribution of constituent atoms may be varied by exposure to pulsed laser light, and wherein the waveguide core is formed by exposure to pulse-laser light such that the material of the core is different from the substrate's bulk material in at least one of the respects of density, distribution of constituent atoms, and relative amounts of constituent atoms.

12. The optical-routing board of claim 7 further comprising reflective material disposed on the at least one sidewall.

13. The optical-routing board of claim 7 further comprising:

a beveled surface formed at the at least one side of the substrate; and an additional waveguide core formed within said non-laminated substrate, the additional waveguide core having a first segment extending from the substrate's top surface to a third point on the at least one sidewall of the first void, a second segment extending from the third point to a fourth point on the beveled surface, and a third segment extending from the fourth point to the substrate's top surface.

14. The optical-routing board of claim 7 wherein the first void has a second side wall, wherein the non-laminated substrate has a second side, and wherein the optical routing board further comprises an additional waveguide core formed within said non-laminated substrate, the additional waveguide core having a first segment extending from the substrate's top surface to a third point on the second sidewall of the first void, and a second segment extending from the third point to a fourth point on the second side of the substrate.

15. The optical-routing board of claim 7 further comprising a plurality of electrical traces formed above the substrate's top surface.

16. The optical-routing board of claim 7 wherein the board is for least routing optical signals of a first wavelength, the first wavelength being within the range of 900 nm to 1600 nm, and wherein the substrate comprises material that is substantially transparent to light at the first wavelength.

17. The optical-routing board of claim 7 wherein the first void has a shape that comprises one of the following: a pyramid, a truncated pyramid, a cone, a truncated cone, a hemisphere, a partial sphere.

18. An optical-routing board comprising:

a non-laminated substrate having a top surface, a bottom surface, and at least one side;

a first void formed at the bottom surface of the non-laminated substrate, the first void having as least one sidewall;

a second void formed at the bottom surface of the non-laminated substrate, the second void having as least one sidewall;

a waveguide core formed within said non-laminated substrate having a first segment extending from the substrate's top surface to a first point on the at least one sidewall of the first void, a second segment extending from the first point to a second point on the at least one sidewall of the second void, and a third segment extending from the second point to the substrate's top surface.

19. The optical-routing board of claim 18 wherein the substrate comprises a bulk material whose density and or distribution of constituent atoms may be varied by exposure to pulsed laser light, and wherein the waveguide core is formed by exposure to pulse-laser light such that the material of the core is different from the substrate's bulk material in at least one of the respects of density, distribution of constituent atoms, and relative amounts of constituent atoms.

20. The optical-routing board of claim 18 further comprising reflective material disposed on the sidewalls of the first and second voids.

21. The optical-routing board of claim 18 further comprising:

a third void formed at the bottom surface of the non-laminated substrate, the third void having as least one sidewall;

a second waveguide core formed within said non-laminated substrate having a first segment extending from the substrate's top surface to a third point on the at least one sidewall of the first void, a second segment extending from the third point to a fourth point on the at least one sidewall of the third void, and a third segment extending from the fourth point to the substrate's top surface.

22. The optical-routing board of claim 18 further comprising a plurality of electrical traces formed above the substrate's top surface.

* * * * *